(12) United States Patent
He et al.

(10) Patent No.: US 9,837,497 B1
(45) Date of Patent: Dec. 5, 2017

(54) CHANNEL STRUCTURE AND MANUFACTURING METHOD THEREOF

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/296,045

(22) Filed: Oct. 18, 2016

(51) Int. Cl.
*H01L 29/66* (2006.01)
*H01L 29/165* (2006.01)
*H01L 21/306* (2006.01)
*H01L 29/786* (2006.01)
*H01L 29/76* (2006.01)
*H01L 29/423* (2006.01)
*H01L 29/34* (2006.01)
*H01L 29/06* (2006.01)
*H01L 29/20* (2006.01)
*H01L 29/24* (2006.01)
*H01L 21/308* (2006.01)

(52) U.S. Cl.
CPC .......... *H01L 29/34* (2013.01); *H01L 21/3085* (2013.01); *H01L 21/30604* (2013.01); *H01L 29/0692* (2013.01); *H01L 29/20* (2013.01); *H01L 29/24* (2013.01)

(58) Field of Classification Search
CPC ............. H01L 29/263; H01L 29/78693; H01L 29/42364; H01L 29/24; H01L 29/42356; H01L 29/78696; H01L 29/247
USPC .............................. 257/43, 288, 77; 438/104
See application file for complete search history.

(56) References Cited

U.S. PATENT DOCUMENTS

| 9,006,736 | B2 | 4/2015 | Sasagawa |
| 9,209,256 | B2 | 12/2015 | Tokunaga |
| 2014/0001465 | A1* | 1/2014 | Yamazaki ......... H01L 29/66969 257/43 |
| 2015/0001534 | A1 | 1/2015 | Chang |
| 2015/0123144 | A1 | 5/2015 | Wu |
| 2015/0372116 | A1 | 12/2015 | Vellianitis |

* cited by examiner

*Primary Examiner* — Kimberly Rizkallah
*Assistant Examiner* — Brian Turner
(74) *Attorney, Agent, or Firm* — Winston Hsu

(57) ABSTRACT

A channel structure includes a first patterned channel layer including a lower portion and an upper portion. The upper portion is disposed on the lower portion. A width of the upper portion is larger than a width of the lower portion. A material or a material composition ratio of the upper portion is different from a material or a material composition ratio of the lower portion. The height and the channel length of the channel structure are increased by disposing the first patterned channel layer, and the saturation current ($I_{sat}$) of a transistor including the channel structure of the present invention may be enhanced accordingly.

18 Claims, 7 Drawing Sheets

CHANNEL STRUCTURE AND MANUFACTURING METHOD THEREOF

BACKGROUND OF THE INVENTION

1. Field of the Invention

The present invention relates to a channel structure and a manufacturing method thereof, and more particularly, to a semiconductor channel structure and a manufacturing method thereof.

2. Description of the Prior Art

Oxide semiconductor materials, such as indium gallium zinc oxide (IGZO), have been applied in thin film transistors (TFTs) of display devices and field effect transistors (FETs) used in integrated circuits because of properties such as high mobility and low leakage current. However, although the leakage current of the transistor including the oxide semiconductor layer is relatively low, the application field of the present oxide semiconductor transistor is still limited because the threshold voltage (Vt) of the oxide semiconductor transistor is still too high and the saturation current ($I_{sat}$) of the oxide semiconductor transistor is not high enough for some application such as low power devices. Therefore, it is an important subject for the related industries to improve the electrical performances of the oxide semiconductor transistor by modifying the oxide semiconductor channel structure.

SUMMARY OF THE INVENTION

A channel structure and a manufacturing method thereof are provided by the present invention. In the channel structure, a first patterned channel layer includes a lower portion and an upper portion. A width of the upper portion is larger than a width of the lower portion, and a material or a material composition ratio of the upper portion is different from a material or a material composition ratio of the lower portion. The height and the channel length of the channel structure are increased for enhancing the saturation current ($I_{sat}$) of a transistor including the channel structure of the present invention.

According to one embodiment of the present invention, a channel structure is provided. The channel structure includes a first patterned channel layer. The first patterned channel layer includes a lower portion and an upper portion. A width of the upper portion is larger than a width of the lower portion, and a material or a material composition ratio of the upper portion is different from a material or a material composition ratio of the lower portion.

According to one embodiment of the present invention, a manufacturing method of a channel structure is provided. The manufacturing method includes the following steps. A first patterned channel layer is formed on a substrate. The first patterned channel layer includes a lower portion and an upper portion. A width of the upper portion is larger than a width of the lower portion, and a material or a material composition ratio of the upper portion is different from a material or a material composition ratio of the lower portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-12 are schematic drawings illustrating a manufacturing method of the channel structure according to the first embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, and FIG. 12 is a schematic drawing in a step subsequent to FIG. 11.

DETAILED DESCRIPTION

Figure 1:
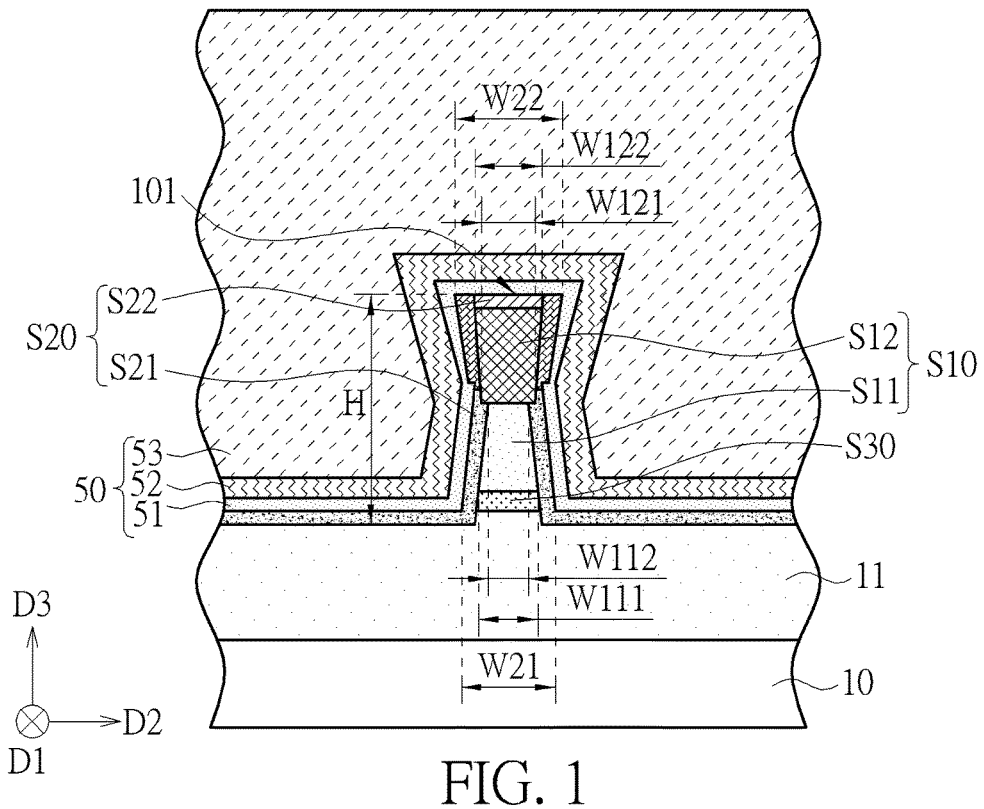
FIG. 1 is a schematic drawing illustrating a channel structure according to a first embodiment of the present invention.
Figure 2:
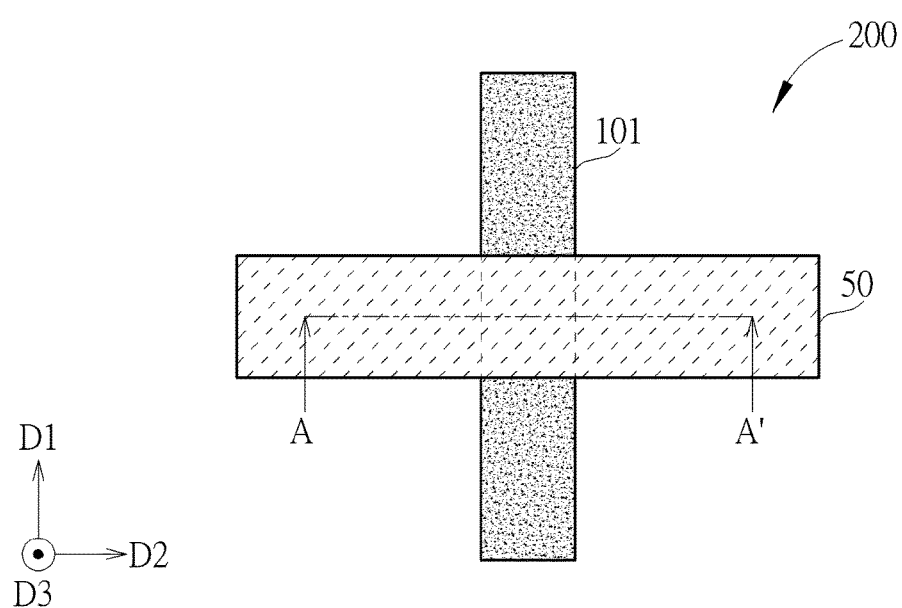
FIG. 2 is a top view diagram illustrating a transistor including the channel structure of the first embodiment of the present invention.

Please refer to FIG. 1 and FIG. 2. FIG. 1 is a schematic drawing illustrating a channel structure according to a first embodiment of the present invention, and FIG. 2 is a top view diagram illustrating a transistor including the channel structure of this embodiment. FIG. 1 may be regarded as a cross-sectional diagram taken along a line A-A' in FIG. 2. As shown in FIG. 1 and FIG. 2, a channel structure 101 is provided in this embodiment. The channel structure 101 includes a first patterned channel layer S10. The first patterned channel layer S10 includes a lower portion S11 and an upper portion S12. The upper portion S12 is disposed on the lower portion S11, and a width of the upper portion S12 (such as a width W122 shown in FIG. 1) is larger than a width of the lower portion S11 (such as a width W111 shown in FIG. 1). A material or a material composition ratio of the upper portion S12 is different from a material or a material composition ratio of the lower portion S11. For example, the first patterned channel layer S10 may include oxide semiconductor layers, III-V group semiconductor layers, or other suitable semiconductor materials. The III-V group semiconductor layers mentioned above may include silicon, germanium, silicon germanium, or other suitable III-V group semiconductor materials. The oxide semiconductor layers mentioned above may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, $SnSbO_2$), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned materials, but not limited thereto. The material of the upper portion S12 may be different from the material of the lower portion S11. In some embodiments, the material of the upper portion S12 may be similar to the material of the lower portion S11, but the material composition ratio of the upper portion S12 is different from the material composition ratio of the lower portion S11. For instance, the materials of the upper portion S12 and the lower portion S11 may be IGZO, but the material composition ratio (such as the ratio between indium, gallium, and/or zinc) of the upper portion S12 is different from that of the lower portion S11.

The channel structure 101 may further include a second patterned channel layer S20. The second patterned channel layer S20 directly covers the first patterned channel layer S10. The second patterned channel layer S20 includes a second part S22 and a first part S21. The second part S22 is disposed above a top surface of the first patterned channel layer S10 in a vertical direction D3. The first part S21 is disposed on a sidewall of the first patterned channel layer S10. A width W22 of the second part S22 of the second patterned channel layer S20 is larger than a width W21 of the first patterned channel layer S10 and the first part S21 of the second patterned channel layer S20.

Specifically, the channel structure 101 may be disposed on a substrate 10, and an insulation layer 11 may be disposed between the channel structure 101 and the substrate 10 optionally. The second patterned channel layer S20 may also include oxide semiconductor layers, III-V group semiconductor layers, or other suitable semiconductor materials. The substrate 10 may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. For example, when the first patterned channel layer S10 and the second patterned channel layer S20 are oxide semiconductor layers and the substrate 10 is a semiconductor substrate, a plurality of silicon-based field effect transistors (not shown) may be formed on the semiconductor substrate before the steps of forming the channel structure 101, and the insulation layer 11 may be formed to cover the silicon-based field effect transistors, but not limited thereto.

In this embodiment, the channel structure 101 may be applied in a transistor 200 as shown in FIG. 2, but not limited thereto. As shown in FIG. 1 and FIG. 2, the channel structure 101 may be a fin type semiconductor channel structure elongated in a first direction D1, and a gate structure 50 elongate in a second direction D2 may be disposed straddling the channel structure 101. The first direction D1 may be substantially orthogonal to the second direction D2, but not limited thereto. Two source/drain electrodes (not shown) may be formed at two opposite sides of the gate structure 50 in the first direction D1, and the source/drain electrodes may be formed on the channel structure 101, be formed between the channel structure 101 and the substrate 10, or be formed in the channel structure 101. The gate structure 50 may include a gate insulation layer 51, a barrier layer, and a low resistance conductive layer 53 sequentially formed on the channel structure 101, but not limited thereto As shown in FIG. 1 and FIG. 2, a height H of the channel structure 101 may be increased by the upper part S12 of the first patterned channel layer S10, and a channel length (or a contact area between the channel structure 101 and the gate structure 50) may be increased because the second part S22 of the second patterned channel layer S20 is relatively wider. Therefore, relative electrical performances, such as saturation current ($I_{sat}$), of the transistor 200 including the channel structure 101 may be enhanced. The resistance between the channel structure 101 and the source/drain electrodes formed on the channel structure 101 may be reduced because the contact area between the source/drain electrodes and the channel structure 101 is increased relatively. Accordingly, the height H of the channel structure 101 is larger than the width of the channel structure 101 (such as the width W22 shown in FIG. 1), and the channel structure 101 may be regarded as a fin type semiconductor channel structure accordingly.

In addition, the upper portion S12 directly contacts the lower portion S11, and the second patterned channel layer S20 directly contacts a top surface of the upper portion S12, a sidewall of the upper portion S12, and a sidewall of the lower portion S11. Additionally, the channel structure 101 may further include a third patterned channel layer S30 disposed under the first patterned channel layer S10. The first patterned channel layer S10 may be directly disposed on the third patterned channel layer S30, and the second patterned channel layer S20 may further cover the third patterned channel layer S30. The second patterned channel layer S20 may directly contact and cover the top surface of the upper portion S12, the sidewall of the upper portion S12, the sidewall of the lower portion S11, and a sidewall of the third patterned channel layer S30. In other words, the second patterned channel layer S20 and the third patterned channel layer S30 may encompass the first patterned channel layer S10 completely, but not limited thereto. The third patterned channel layer S30 may include oxide semiconductor layers, III-V group semiconductor layers, or other suitable semiconductor materials. The material of the third patterned channel layer S30 may be similar to that of the second patterned channel layer S20, but not limited thereto. For example, when the first patterned channel layer S10, the second patterned channel layer S20, and the third patterned channel layer S30 are oxide semiconductor channel layers, an electrical resistivity of the first patterned channel layer S10 may be higher than an electrical resistivity of the second patterned channel layer S20 and an electrical resistivity of the third patterned channel layer S30 for lowering the contact resistance between the gate structure 50 and the channel structure 101 and/or the contact resistance between the channel structure 101 and the source/drain electrodes. Additionally, an energy level of a bottom of a conduction band of the first patterned channel layer S10 may be lower than an energy level of a bottom of a conduction band of the second patterned channel layer S20 and an energy level of a bottom of a conduction band of the third patterned channel layer S30 preferably for keeping unwanted materials, such as silicon, from entering the first patterned channel layer S10 by passing through the second patterned channel layer S20 and/or the third patterned channel layer S30 and deteriorating the material properties of the first patterned channel layer S10.

Please refer to FIGS. 3-12 and FIG. 1. FIGS. 3-12 are schematic drawings illustrating a manufacturing method of the channel structure 101 in this embodiment. The manufacturing method of the channel structure 101 may include but is not limited to the following steps. As shown in FIG. 1, the first patterned channel layer S10 is formed on the substrate 10. The second patterned channel layer S20 is formed directly covering the first patterned channel layer S10. The second patterned channel layer S20 includes the second part S22 disposed above the top surface of the first patterned channel layer S10 and the first part S21 disposed on the sidewall of the first patterned channel layer S10. The width W22 of the second part S22 of the second patterned channel layer S20 is larger than the width W21 of the first patterned channel layer S10 and the first part S21 of the second patterned channel layer S20. In this embodiment, the width W22 of the second part S22 may be the distance between two ends of the second part S1 in the second direction D2, and the width W21 may be the distance between two outmost surfaces of the first part S21 in the second direction D2, but not limited thereto. The first patterned channel layer S10 in this embodiment includes the lower portion S11 and the upper portion S12 disposed on the lower portion S11, and the width W122 of the upper portion S12 is larger than the width will of the lower portion S11. The upper portion S12 directly contacts the lower portion S11, and the second patterned channel layer S20 directly contacts the top surface of the upper portion S12, the sidewall of the upper portion S12, and a sidewall of the lower portion S11.

Figure 3:
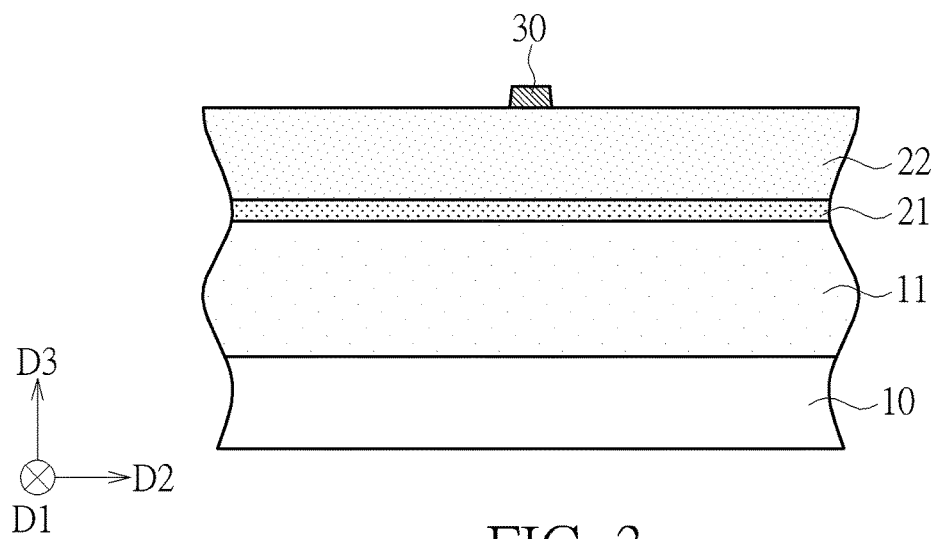
Figure 4:
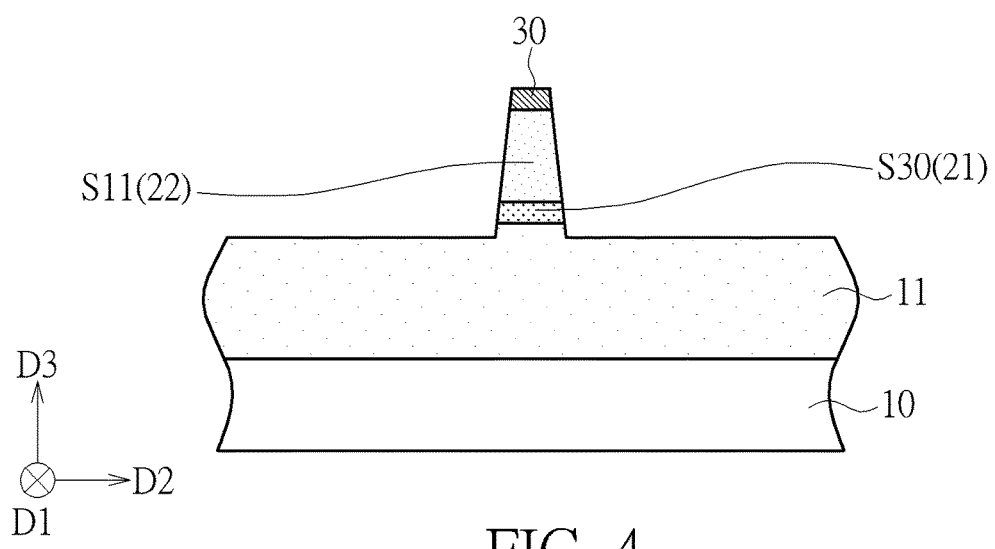

In some embodiments, the third patterned channel layer S30 may be formed under the first patterned channel layer S10. The method of forming the third patterned channel layer S30 and the lower portion S11 of the first channel layer S10 may include but is not limited to the following steps. As shown in FIG. 3 and FIG. 1, a first semiconductor layer 21 is formed on the substrate 10, a second semiconductor layer 22 is formed on the first semiconductor layer 21, and a patterned mask layer 30 is formed on the second semiconductor layer 22. The first semiconductor layer 21 is used to be patterned for forming the third patterned channel layer S30, and the second semiconductor layer 21 is used to be patterned for forming the lower portion S11 of the first patterned channel layer S10. The first semiconductor layer 21 and the second semiconductor layer 21 may include oxide semiconductor materials, III-V group semiconductor materials, or other suitable semiconductor materials. The first semiconductor layer 21 may be thinner than the second semiconductor layer 22, and the thickness of the lower portion S11 of the first patterned channel layer S10 is larger than the thickness of the third patterned channel layer S30 in the vertical direction D3 preferably, but not limited thereto. As shown in FIG. 3 and FIG. 4, an etching process with the patterned mask layer 30 as a mask is then performed for removing a part of the second semiconductor layer 22 and a part of the first semiconductor layer 21 and forming the third patterned channel layer S30 and the lower portion S11 of the first patterned channel layer S10. Accordingly, the lower portion S11 of the first patterned channel layer S10 is formed self-aligned with the third patterned channel layer S30. In some embodiments, when the insulation layer 11 is formed on the substrate 10 before the step of forming the first semiconductor layer 21, a part of the insulation layer 11 may also be removed by the etching process mentioned above, but not limited thereto.

Figure 5:
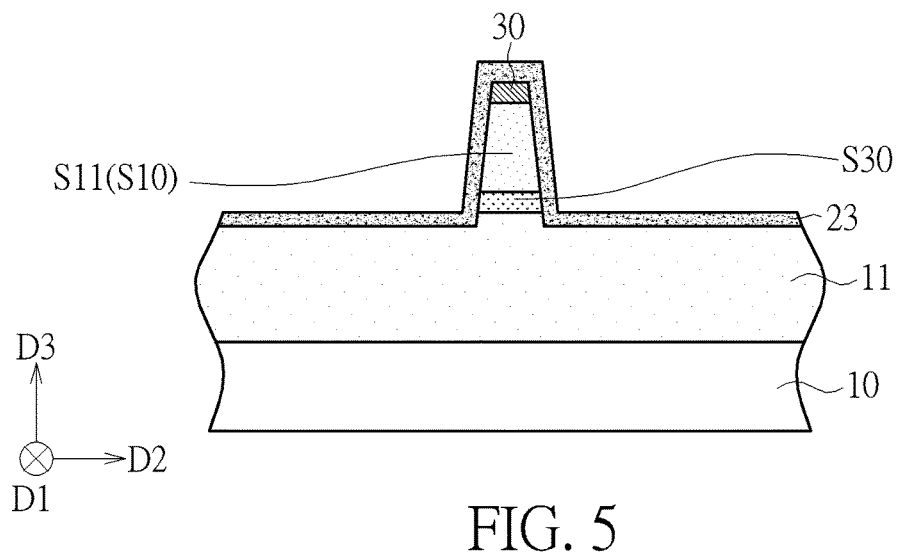
Figure 6:
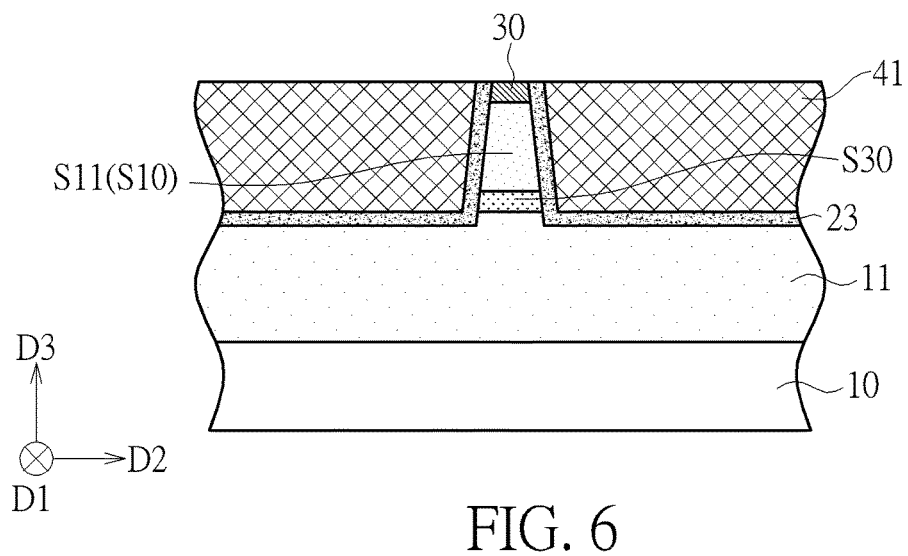
Figure 7:
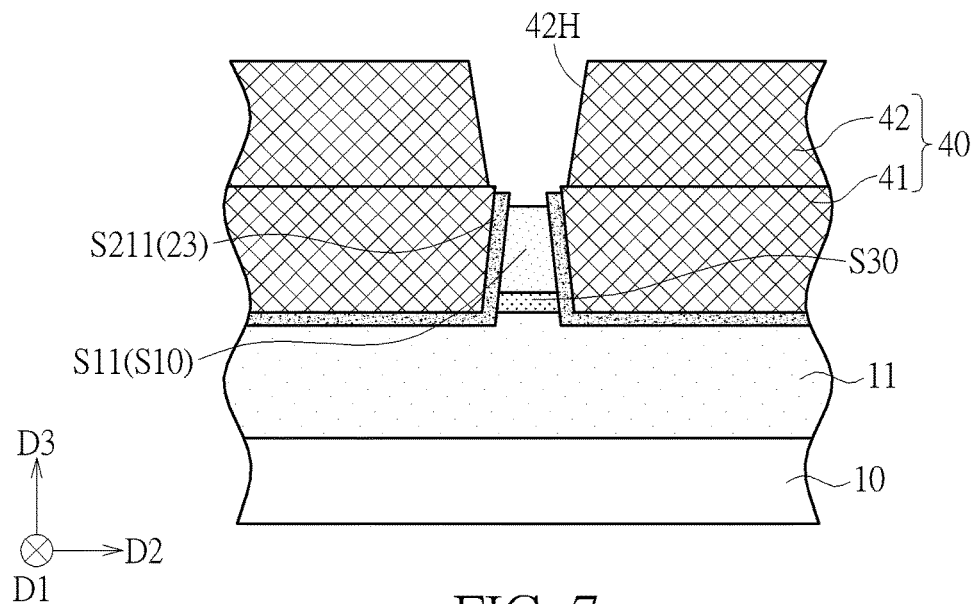

The method of forming the first part of the second patterned channel layer mentioned above may include but is not limited to the following steps. As shown in FIG. 5, a third semiconductor layer 23 is formed covering the patterned mask layer 30, the lower portion S11 of the first patterned channel layer S10, the third patterned channel layer S30, and the insulation layer 11. The third semiconductor layer 23 is used to be patterned for forming a part of the second patterned channel layer mentioned above, and the third semiconductor layer 23 may include oxide semiconductor materials, III-V group semiconductor materials, or other suitable semiconductor materials. As shown in FIG. 5 and FIG. 6, a first dielectric layer may be formed on the third semiconductor layer 23, and a planarization process, such as a chemical mechanical polishing (CMP) process, or an etching back process may be performed to remove a part of the first dielectric layer 41 and a part of the third semiconductor layer 23 on the patterned mask layer 30 for exposing a top surface of the patterned mask layer 30. Subsequently, as shown in FIG. 6 and FIG. 7, a second dielectric layer 42 is formed on the first dielectric layer 41, and an opening 42H is formed penetrating the second dielectric layer 42 corresponding to the patterned mask layer 30, the lower portion S11 of the first patterned channel layer S10, and the third patterned channel layer S30. The first dielectric layer 41 and the second dielectric layer 42 may be regarded as one dielectric layer 40 including the opening 42H and formed on the third semiconductor layer 23. Subsequently, the patterned mask layer 30 is removed for exposing the lower portion S11 of the first patterned channel layer S10. In some embodiments, the patterned mask layer 30 and a part of the third semiconductor layer 23 covering the patterned mask layer 30 may also be removed together after the step of forming the opening 42H, and the dielectric layer 40 may be a single layer structure, but not limited thereto. It is worth noting that a projective area of the opening 42H in the vertical direction D3 may be larger than a projective area of the third patterned channel layer S30, the lower portion S11 of the first patterned channel layer S10, the patterned mask layer 30 and the third semiconductor layer 23 formed on the third patterned channel layer S30 and the lower portion S11 in the vertical direction D3 preferably for ensuring that the upper portion of the first patterned channel layer S10 formed in the opening 42H subsequently may be self-aligned with the lower portion S11. Accordingly, the width of upper portion of the first patterned channel layer S10 will be larger than the width of the lower portion S11.

Figure 8:
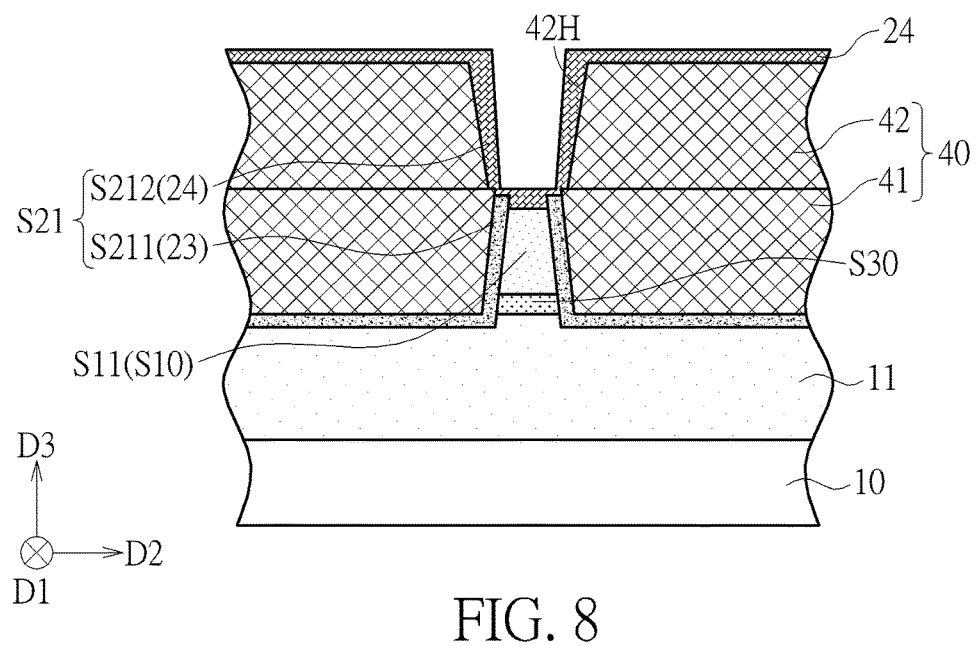
Figure 9:
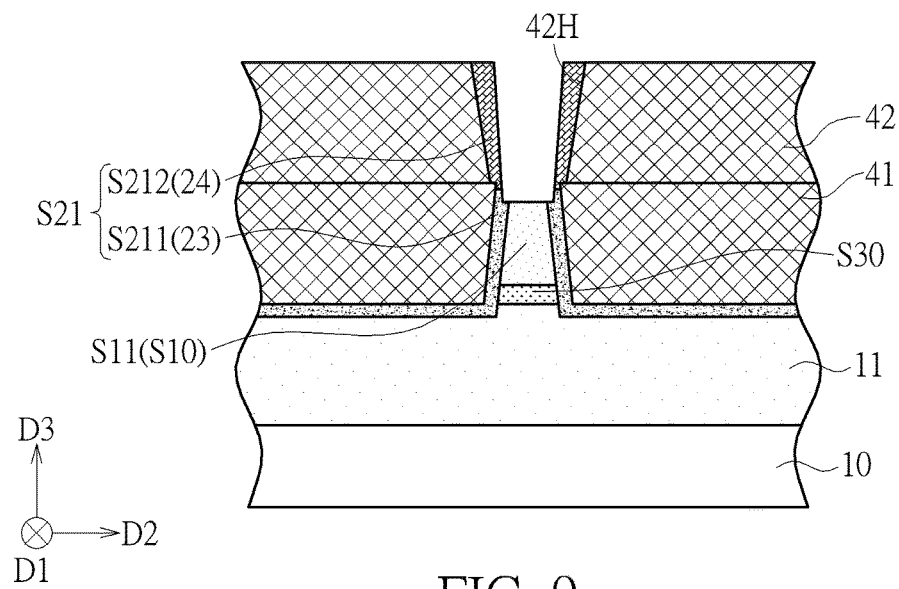
Figure 10:
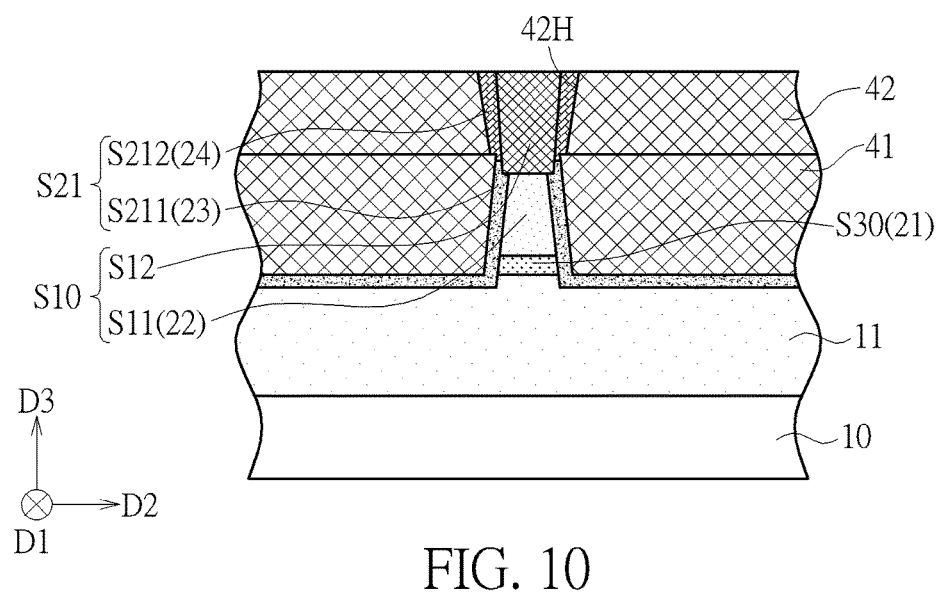

As shown in FIG. 7 and FIG. 8, a fourth semiconductor layer 24 is formed conformally on the dielectric layer 40, a surface of the opening 42H, and the top surface of the lower portion S11 of the first patterned channel layer S10. As shown in FIG. 8 an FIG. 9, a part of the fourth semiconductor layer 24 on the lower portion S11 of the first patterned channel layer S10 is removed for exposing a part of the lower portion S11 of the first patterned channel layer S10. The fourth semiconductor layer 24 on the lower portion S11 may be removed by an etching process with high selectivity between the fourth semiconductor layer 24 and the lower portion S11 of the first patterned channel layer S10, and the fourth semiconductor layer 24 formed on the top surface of the dielectric layer 40 may also be removed by this etching process, but not limited thereto. As shown in FIG. 9 and FIG. 10, the upper portion S12 of the first patterned channel layer S10 is formed in the opening 42H of the dielectric layer 40 after the step of removing a part of the fourth semiconductor layer 24 on the lower portion S11 of the first patterned channel layer S10, and the upper portion S12 directly contacts the lower portion S11. The upper portion S12 of the first patterned channel layer S10 may be formed by filling the opening 42H with a semiconductor material similar to the second semiconductor layer 22, and a planarization process may be performed to remove the semiconductor material formed on the dielectric layer, but not limited thereto. In some embodiments, the first part S21 of the second patterned channel layer S20 may include a lower portion 5211 and an upper portion 5212 connected with each other. The lower portion 5211 of the first part S21 covers the sidewall of the lower portion S11 of the first patterned channel layer S10 and the sidewall of the third patterned channel layer S30, and the upper portion 5212 of the first part S21 covers the sidewall of the upper portion S12 of the first patterned channel layer S10. The lower portion 5211 may be mainly made of the third semiconductor layer 23, the upper portion 5212 may be mainly made of the fourth semiconductor layer 24, and the material properties of the fourth semiconductor layer 24 may be similar to or different from those of the third semiconductor layer 23 preferably.

Figure 11:
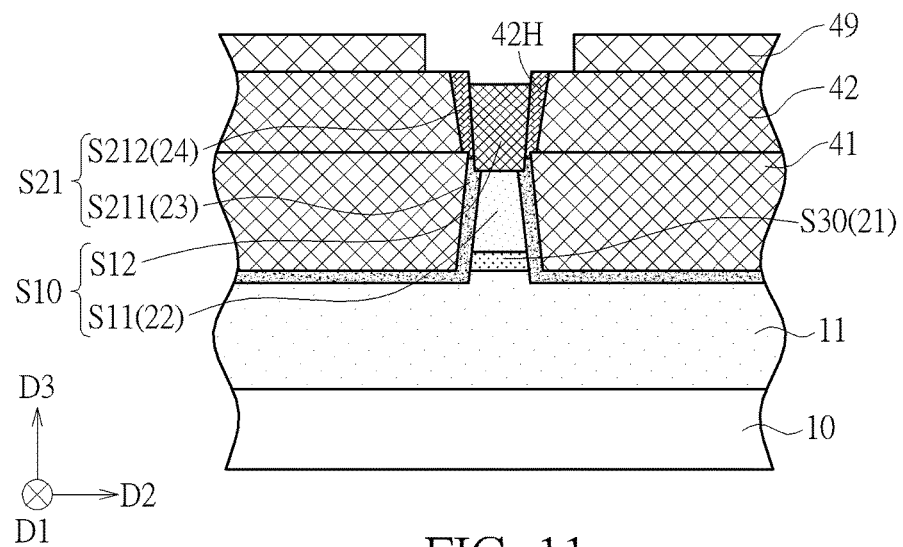
Figure 12:
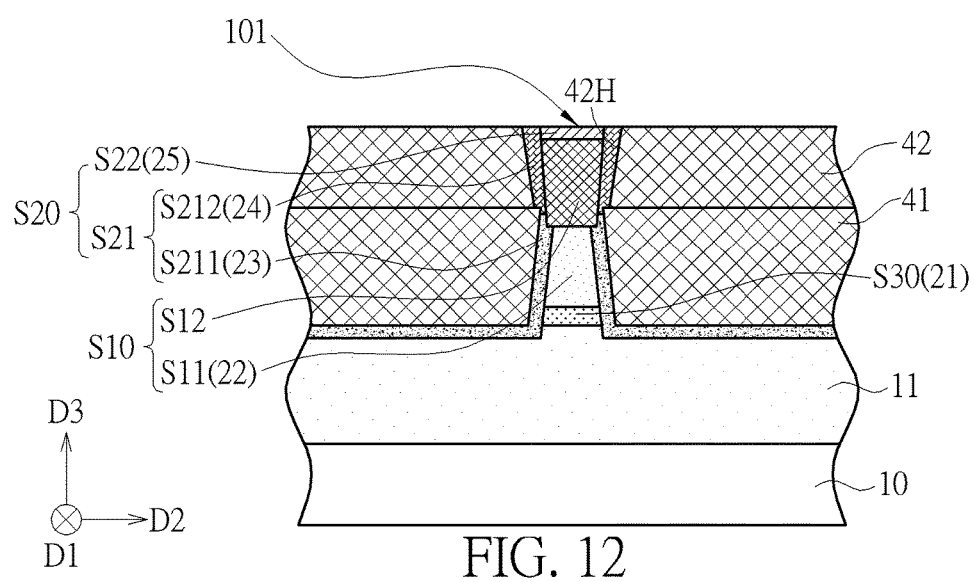

As shown in FIG. 11 and FIG. 12, the method of forming the second part S22 of the second patterned channel layer S20 may include but is not limited to the following steps. A part of the upper portion S12 of the first patterned channel layer S10 in the opening 42H is removed. Specifically, the upper portion S12 of the first patterned channel layer S10 in the opening 42H may be recessed by a recessing process with a mask layer 49 formed on the second dielectric layer 42. A fifth semiconductor layer 25 is then formed on the upper portion S12 of the first patterned channel layer S10 and the first part S21 of the second patterned channel layer S20 for forming the second part S22 of the second patterned channel layer S20. The mask layer 49 is removed after the step of forming the fifth semiconductor layer 25, and a planarization process may be performed to remove the fifth semiconductor layer 25 formed on the second dielectric layer 42. Accordingly, the second part S22 of the second patterned channel layer S20 may be mainly made of the fifth semiconductor layer 25 and be partly made of the fourth semiconductor layer 24, and the material properties of the fifth semiconductor layer 25 may be similar to or different from those of the fourth semiconductor layer 24 preferably, but not limited thereto. The second part S22 and the first part S21 of the second patterned channel layer S20 are connected with one another. The channel structure 101 may be obtained by the manufacturing method described above. As shown in FIG. 12 and FIG. 1, a part of the first dielectric layer 41 and the second dielectric layer 42 may be removed for forming the gate structure 50 straddling the channel structure 101. In the channel structure 101, an upper width (such as the width W122 shown in FIG. 1) of the upper portion S12 is larger than a lower width (such as the width W121 shown in FIG. 1) of the upper portion S12, and an upper width (such as the width W112 shown in FIG. 1) of the lower portion S11 is smaller than a lower width (such as the width Will shown in FIG. 1) of the lower portion S11 because of the characteristics of the manufacturing method, such as the tapered sidewalls formed by the etching process, but not limited thereto. Accordingly, the upper portion S12 of the first patterned channel layer S10 may be formed on the lower portion S11 by the process different from the process of forming the lower portion S11, and the first patterned channel layer S10 may be regarded as being formed by a double patterning process for increasing the height and the channel length of the channel structure 101. In other words, in the present invention, the height of the patterned channel layer will not be limited by the manufacturing ability of one patterning process, and the flexibility of adjusting the height to width ration of the channel structure may be increased accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 13:
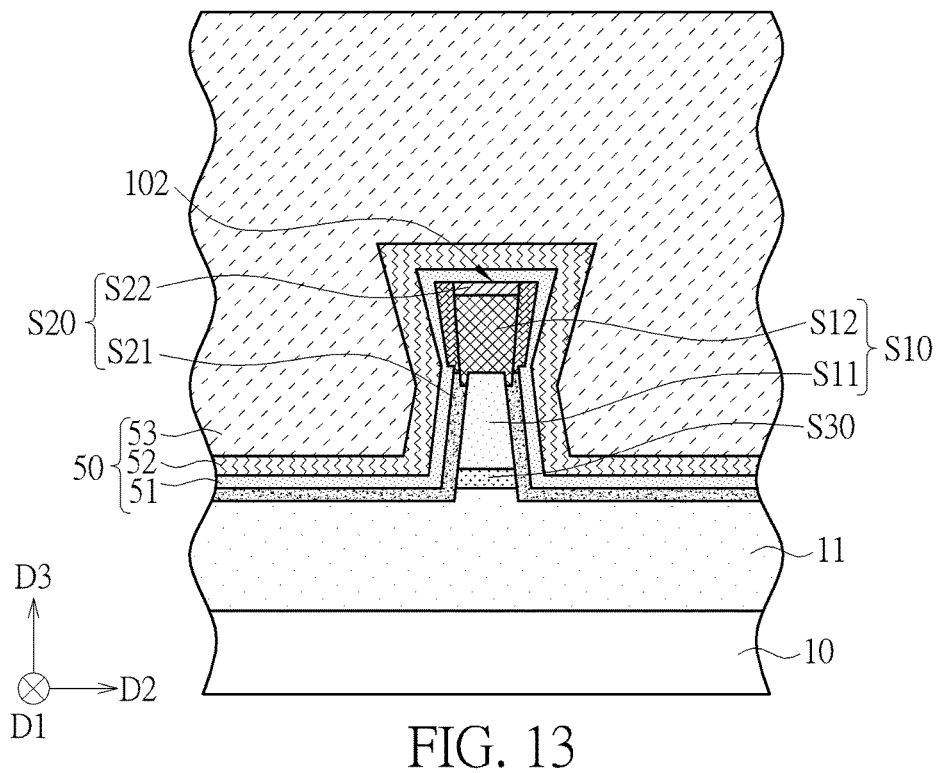
FIG. 13 is a schematic drawing illustrating a channel structure according to a second embodiment of the present invention.

Please refer to FIG. 13. FIG. 13 is a schematic drawing illustrating a channel structure 102 according to a second embodiment of the present invention. As shown in FIG. 13, the differences between this embodiment and the first embodiment mentioned above is that in the channel structure 102, the upper portion S12 of the first patterned channel layer S10 directly covers the top surface of the lower portion S11 and a part of the sidewall of the lower portion S11. In other words, the upper portion S12 of the first patterned channel layer S10 may become relatively wider than that of the first embodiment by forming upper portion S12 of the first patterned channel layer S10 in a larger opening of the dielectric layer, but not limited thereto. The current density of the channel structure 102 may be further increased by the relatively bigger upper portion S12 of the first patterned channel layer S10.

Figure 14:
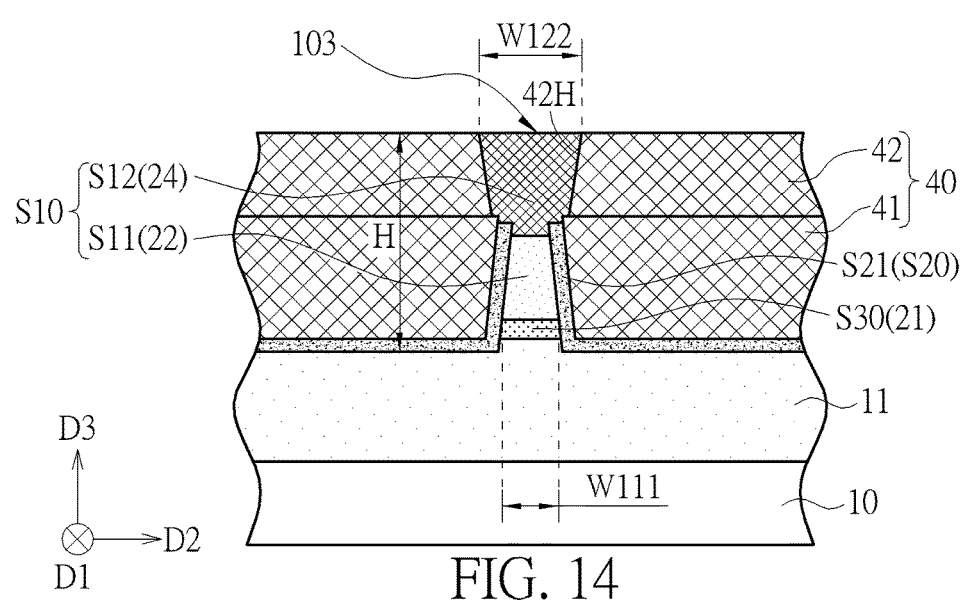
FIG. 14 is a schematic drawing illustrating a channel structure according to a third embodiment of the present invention.

Please refer to FIG. 14. FIG. 14 is a schematic drawing illustrating a channel structure 103 according to a third embodiment of the present invention. As shown in FIG. 14, the differences between this embodiment and the first embodiment mentioned above is that the upper portion S12 of the first patterned channel layer S10 in this embodiment may be made of the fourth semiconductor layer 24. Please refer to FIG. 14 and FIG. 6-7. FIG. 14 may be regarded as a schematic drawing in a step subsequent to FIG. 7. As shown in 14, the first patterned channel layer S10 in this embodiment includes the lower portion S11 and the upper portion S12. As shown in FIGS. 6-7 and FIG. 14, the upper portion S12 of the first patterned channel layer S10 is formed in the opening 42H of the dielectric layer 40 after the step of removing the patterned mask layer 30, and the upper portion S12 of the first patterned channel layer S10 is directly connected with the first part S21 of the second patterned channel layer S20 and the lower portion S11 of the first patterned channel layer S10. In this embodiment, the upper portion S12 of the first patterned channel layer S10 may be an epitaxial semiconductor material formed by a selective epitaxial growth (SEG) process preferably, but not limited thereto. Accordingly, the width of the upper portion S12 (such as a width W122 shown in FIG. 14) is larger than the width of the lower portion S11 (such as a width W111 shown in FIG. 14).

To summarize the above descriptions, in the channel structure and the manufacturing method thereof in the present invention, the width of the upper portion of the first patterned channel is larger than the width of the lower portion of the first patterned channel, and the width of the second part of the second patterned channel layer disposed above the top surface of the first patterned channel layer is larger than the width of the first part of the second patterned channel layer disposed on the sidewall of the first patterned channel layer. The height and the channel length of the channel structure are increased, and the relative electrical performances, such as the saturation current ($I_{sat}$), of the transistor including the channel structure are improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A channel structure, comprising:
a first patterned channel layer comprising:
a lower portion; and
an upper portion disposed on the lower portion, wherein a width of the upper portion is larger than a width of the lower portion, and a material or a material composition ratio of the upper portion is different from a material or a material composition ratio of the lower portion, wherein a bottommost width of the upper portion is larger than or equal to an uppermost width of the lower portion, and an uppermost width of the upper portion is larger than the bottommost width of the upper portion.

2. The channel structure of claim 1, wherein the upper portion of the first patterned channel layer directly covers a top surface of the lower portion and a part of a sidewall of the lower portion.

3. The channel structure of claim 1, further comprising:
a second patterned channel layer directly covering the first patterned channel layer, wherein the second patterned channel layer comprises a first part disposed on a sidewall of the first patterned channel layer.

4. The channel structure of claim 3, wherein the upper portion directly contacts the lower portion, and the second patterned channel layer directly contacts a top surface of the upper portion, a sidewall of the upper portion, and a sidewall of the lower portion.

5. The channel structure of claim 3, wherein the second patterned channel layer further comprises a second part disposed above a top surface of the first patterned channel layer, wherein a width of the second part of the second patterned channel layer is larger than a width of the first patterned channel layer and the first part of the second patterned channel layer.

6. The channel structure of claim 5, wherein an upper width of the second part of the second patterned channel layer is larger than a lower width of the second part of the second pattern channel layer.

7. The channel structure of claim 3, wherein the first patterned channel layer and the second patterned channel layer comprise oxide semiconductor layers, or III-V group semiconductor layers.

8. The channel structure of claim 3, further comprising a third patterned channel layer, wherein the first patterned channel layer is directly disposed on the third patterned channel layer, and the second patterned channel layer further covers the third patterned channel layer.

9. A manufacturing method of a channel structure, comprising:
forming a first patterned channel layer on a substrate, wherein the first patterned channel layer comprises:
a lower portion; and
an upper portion disposed on the lower portion, wherein a width of the upper portion is larger than a width of the lower portion, and a material or a material composition ratio of the upper portion is different from a material or a material composition ratio of the lower portion, wherein a bottommost width of the upper portion is larger than or equal to an uppermost width of the lower portion, and an uppermost width of the upper portion is larger than the bottommost width of the upper portion.

10. The manufacturing method of claim 9, wherein the upper portion of the first patterned channel layer directly covers a top surface of the lower portion and a part of a sidewall of the lower portion.

11. The manufacturing method of claim 9, further comprising:
forming a second patterned channel layer directly covering the first patterned channel layer, wherein the second patterned channel layer comprises:
a first part disposed on a sidewall of the first patterned channel layer.

12. The manufacturing method of claim 11, wherein the second patterned channel layer further comprises:
a second part disposed above a top surface of the first patterned channel layer, wherein a width of the second part is larger than a width of the first patterned channel layer and the first part of the second patterned channel layer.

13. The manufacturing method of claim 11, wherein the upper portion directly contacts the lower portion, and the second patterned channel layer directly contacts a top surface of the upper portion, a sidewall of the upper portion, and a sidewall of the lower portion.

14. The manufacturing method of claim 12, further comprising:
forming a third patterned channel layer under the first patterned channel layer, wherein steps of forming the third patterned channel layer and the lower portion of the first channel layer comprise:
forming a first semiconductor layer on the substrate;
forming a second semiconductor layer on the first semiconductor layer;
forming a patterned mask layer on the second semiconductor layer; and
performing an etching process with the patterned mask layer as a mask for removing a part of the second semiconductor layer and a part of the first semiconductor layer and forming the third patterned channel layer and the lower portion of the first patterned channel layer.

15. The manufacturing method of claim 14, wherein the first part and the second part of the second patterned channel layer are connected with one another, and steps of forming the first part of the second patterned channel layer comprises:
forming a third semiconductor layer covering the patterned mask layer, the lower portion of the first patterned channel layer, and the third patterned channel layer;
forming a dielectric layer on the third semiconductor layer, wherein the dielectric layer comprises an opening corresponding to the patterned mask layer, the lower portion of the first patterned channel layer, and the third patterned channel layer; and
removing the patterned mask layer and a part of the third semiconductor layer covering the patterned mask layer.

16. The manufacturing method of claim 15, wherein the steps of forming the first part of the second patterned channel layer further comprises:
forming a fourth semiconductor layer conformally on the dielectric layer, a surface of the opening, and a top surface of the lower portion of the first patterned channel layer;
removing a part of the fourth semiconductor layer on the lower portion of the first patterned channel layer for exposing a part of the lower portion of the first patterned channel layer; and
forming the upper portion of the first patterned channel layer in the opening of the dielectric layer after the step of removing a part of the fourth semiconductor layer on the lower portion of the first patterned channel layer, wherein the upper portion directly contacts the lower portion.

17. The manufacturing method of claim 16, wherein steps of forming the second part of the second patterned channel layer comprise:
   removing a part of the upper portion of the first patterned channel layer in the opening; and
   forming a fifth semiconductor layer on the upper portion of the first patterned channel layer and the first part of the second patterned channel layer.

18. The manufacturing method of claim 11, wherein steps of forming the first patterned channel layer and the second patterned channel layer comprise:
   forming a second semiconductor layer on the substrate;
   forming a patterned mask layer on the second semiconductor layer;
   performing an etching process with the patterned mask layer as a mask for removing a part of the second semiconductor layer and forming the lower part of the first patterned channel layer;
   forming a third semiconductor layer covering the patterned mask layer and the lower part of the first patterned channel layer;
   forming a dielectric layer on the third semiconductor layer, wherein the dielectric layer comprises an opening corresponding to the patterned mask layer and the lower part of the first patterned channel layer; and
   removing the patterned mask layer and a part of the third semiconductor layer covering the lower part of the patterned mask layer, wherein the upper portion of the first patterned channel layer is formed in the opening of the dielectric layer after the step of removing the patterned mask layer, and the upper portion of the first patterned channel layer is directly connected with the first part of the second patterned channel layer and the lower portion of the first patterned channel layer.

* * * * *